(12) United States Patent
Mao et al.

(10) Patent No.: US 8,899,702 B2
(45) Date of Patent: Dec. 2, 2014

(54) LATCH MECHANISM, ELECTRONIC APPARATUS HAVING THE SAME, AND METHOD FOR REMOVING A SHELL COVER FROM A SHELL BASE USING THE SAME

(71) Applicant: Wistron Corporation, New Taipei (TW)

(72) Inventors: Zhong-Hui Mao, New Taipei (TW); Dong-Ying Chen, New Taipei (TW); Zhang-Rong Jin, New Taipei (TW); Hung-Ming Chang, New Taipei (TW)

(73) Assignee: Wistron Corporation, New Taipei (TW)

( * ) Notice: Subject to any disclaimer, the term of this patent is extended or adjusted under 35 U.S.C. 154(b) by 4 days.

(21) Appl. No.: 13/792,111

(22) Filed: Mar. 10, 2013

(65) Prior Publication Data

US 2014/0001942 A1    Jan. 2, 2014

(30) Foreign Application Priority Data

Jun. 27, 2012 (CN) .......................... 2012 1 0218816

(51) Int. Cl.
| | |
|---|---|
| A47B 95/02 | (2006.01) |
| E05C 7/06 | (2006.01) |
| A47B 81/00 | (2006.01) |
| A47B 97/00 | (2006.01) |
| H05K 7/16 | (2006.01) |
| H05K 5/02 | (2006.01) |

(52) U.S. Cl.
CPC .................................. *H05K 5/0239* (2013.01)
USPC ..................... 312/332.1; 312/223.2; 312/222; 361/726

(58) Field of Classification Search
CPC ......... G06F 1/181; H05K 5/0221; E05B 9/08; E05B 65/02; E05B 9/002; E05B 17/007; E05B 17/0045; E05B 17/0041; E05B 65/006; E05C 19/006; E05C 1/06
USPC ........ 312/223.2, 265.5, 265.6, 327, 328, 215, 312/222, 319.2, 332.1; 361/724–727
See application file for complete search history.

(56) References Cited

U.S. PATENT DOCUMENTS

| | | | | |
|---|---|---|---|---|
| 3,012,805 | A | * | 12/1961 | Poe ................................ 292/229 |
| 3,393,539 | A | * | 7/1968 | Gehrie .............................. 70/71 |
| 6,362,975 | B1 | * | 3/2002 | Liu et al. ........................ 361/796 |
| 6,398,325 | B1 | * | 6/2002 | Chen et al. .................. 312/223.2 |
| 6,721,183 | B1 | * | 4/2004 | Chen et al. ..................... 361/726 |

(Continued)

FOREIGN PATENT DOCUMENTS

TW               201120322 A1     6/2011

*Primary Examiner* — Janet M Wilkens
*Assistant Examiner* — Andrew Roersma
(74) *Attorney, Agent, or Firm* — The Mueller Law Office, P.C.

(57) ABSTRACT

An electronic apparatus includes a shell base, a shell cover and a latch mechanism including an operating component, a pivot axle and a driving axle. The operating component has an access portion and two support portions extending through the shell cover. The pivot axle extends through the support portions, and has two end parts disposed at opposite lateral sides of the support portions and coupled rotatably to the shell cover. The driving axle extends through the support portions and is received in a limit groove of the shell base. The access portion is pivotable about the pivot axle from a closed position to an open position while the driving axle is positioned in the slide direction, thereby moving the pivot axle and the shell cover relative to the shell base.

18 Claims, 12 Drawing Sheets

(56) References Cited

U.S. PATENT DOCUMENTS

| | | | |
|---|---|---|---|
| 6,757,164 B2 * | 6/2004 | Lin | 361/679.35 |
| 6,824,174 B2 * | 11/2004 | Lin et al. | 292/85 |
| 7,201,407 B2 * | 4/2007 | Schlack | 292/139 |
| 7,325,846 B2 * | 2/2008 | Smith et al. | 292/336.3 |
| 7,916,465 B2 * | 3/2011 | Chen | 361/679.39 |
| 2008/0143218 A1 * | 6/2008 | Alayev | 312/1 |
| 2011/0157779 A1 * | 6/2011 | Chang et al. | 361/679.01 |

* cited by examiner

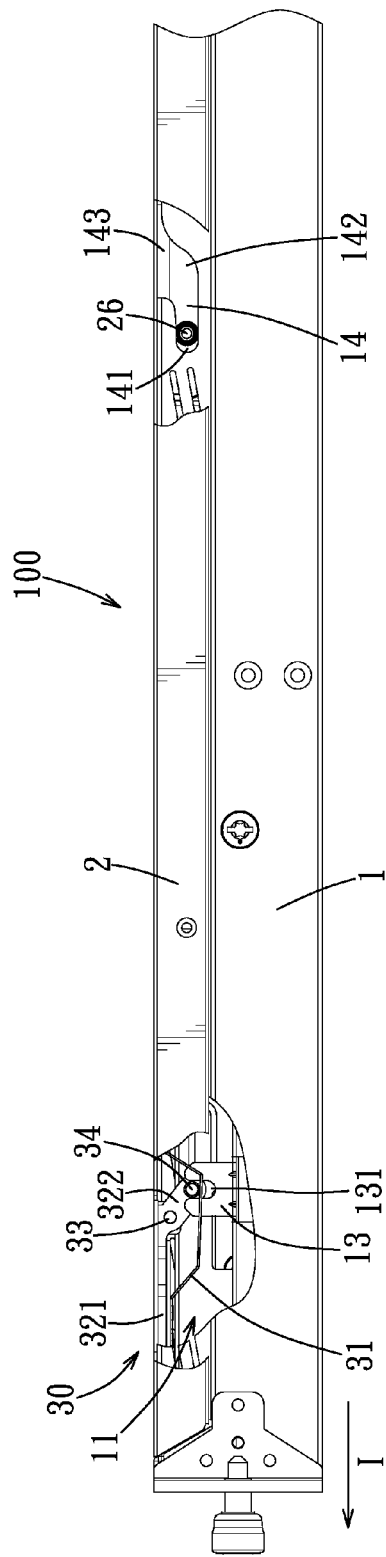
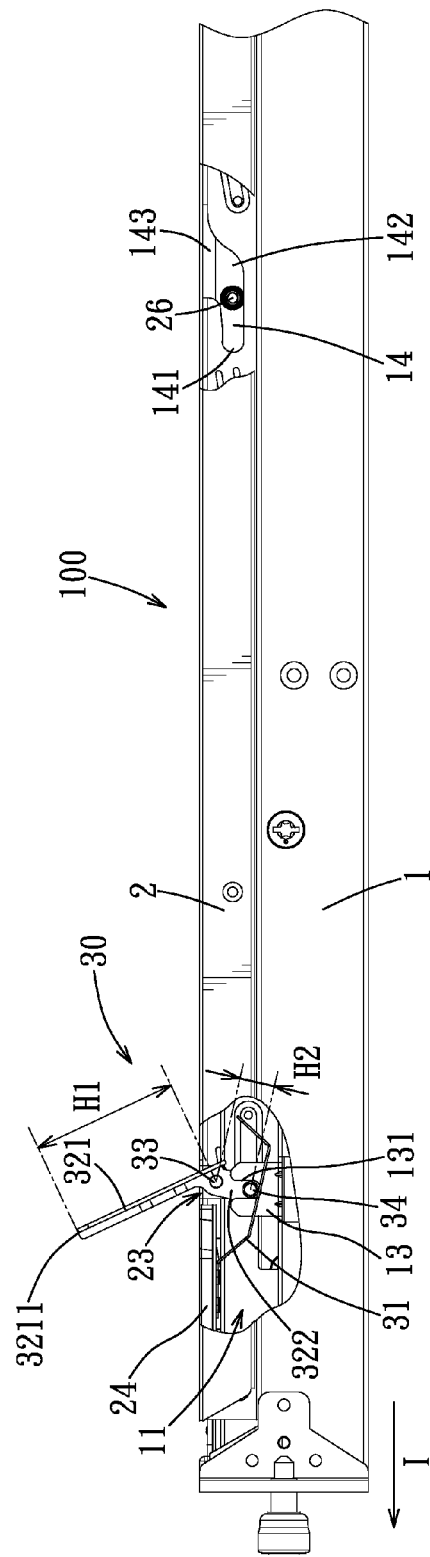
FIG. 11
FIG. 12

LATCH MECHANISM, ELECTRONIC APPARATUS HAVING THE SAME, AND METHOD FOR REMOVING A SHELL COVER FROM A SHELL BASE USING THE SAME

CROSS-REFERENCE TO RELATED APPLICATION

This application claims priority of Chinese Application No. 201210218816.2, filed on Jun. 27, 2012, the disclosure of which is incorporated herein by reference.

BACKGROUND OF THE INVENTION

1. Field of the Invention

The disclosure relates to an electronic apparatus, more particularly to an electronic apparatus having a removable shell cover provided with a latch mechanism that is operable for removing the shell cover.

2. Description of the Related Art

A current electronic apparatus (such as a computer server) generally includes a casing with a shell base and a shell cover. The shell cover is generally coupled removably to the shell base, for example, by using screws or a latch. The latch generally includes a slide mechanism that allows the shell cover to slide back and forth between open and closed positions. At the open position, the shell cover may be removed from the shell base so that electronic components inside the casing may be easily repaired or replaced. At the closed position, the shell cover is held in place by a locking mechanism of the latch.

One disadvantage of the above mechanisms is the inefficient manner in which the shell cover is removed. For those shell covers that use screws to affix the shell cover to the shell base, the screws must be removed in order to remove the shell cover. This not only requires much effort but also much time. For those using the latch, one must release the locking mechanism before the shell cover can be slid off the shell base. Generally, in order to remove the shell cover, one must use one hand to unlock the shell cover and the other hand to simultaneously slide the shell cover. This is not only difficult, but also inconvenient.

SUMMARY OF THE INVENTION

One object of the present disclosure is to provide a latch mechanism easily operable to remove a shell cover from a shell base.

Another object of the present disclosure is to provide an electronic apparatus including the latch mechanism.

Yet another object of the present disclosure is to provide a method for removing a shell cover from a shell base using a latch mechanism.

Accordingly, an electronic apparatus of the present disclosure comprises a shell base, a shell cover and a latch mechanism. The shell base defines an internal space and has an abutment portion that is disposed in the internal space and that is formed with a limit groove opening upwardly. The shell cover is coupled detachably to the shell base, covers the internal space and is slidable relative to the shell base along a slide direction. The shell cover has a through hole aligned with the limit groove of the abutment portion. The latch mechanism includes an operating component, a pivot axle and a driving axle. The operating component has an access portion disposed outside the shell cover, and a pair of spaced-apart support portions extending from the access portion into the internal space through the through hole. The pivot axle is adjacent to the through hole, extends through the support portions of the operating component, and has a pair of end parts disposed respectively at opposite lateral sides of the support portions. The end parts are coupled rotatably to the shell cover. The driving axle extends through the support portions of the operating component, is spaced apart from the pivot axle, is disposed in the internal space and is received and vertically-movable in the limit groove of the abutment portion of the shell base. The access portion is pivotable about the pivot axle between a closed position to be flush with the shell cover, and an open position, where a distal end of the access portion is away from the shell cover. During movement of the access portion from the closed position to the open position, the driving axle is positioned in the slide direction relative to the shell base due to engagement between the driving axle and the abutment portion, thereby resulting in movement of the pivot axle and the shell cover in the slide direction relative to the shell base.

Preferably, the shell cover further has an inner surface facing the internal space, the latch mechanism further including a resilient member that is fastened to the inner surface of the shell cover and biasing the driving axle upwardly for maintaining the access portion in the open or closed position.

According to another aspect of the disclosure, there is provided a method for removing a shell cover from a shell base. The shell base has an abutment portion. The shell cover is mounted with a pivot axle and an operating component that is connected pivotally to the pivot axle. The operating component has an access portion and a support portion that extends from the access portion and that has a distal end portion engaging pivotally to the abutment portion of the shell base. The method comprises the following steps:

(a) lifting the access portion of the operating component, causing pivot movement of the access portion about the pivot axle; and (b) further pivoting the access portion about the pivot axle such that the pivot axle moves from the front of the abutment portion to behind the abutment portion due to the pivot connection between the support portion of the operating component and the abutment portion of the shell base, causing the shell cover to slide backwards relative to the shell base, thereby allowing the shell cover to separate from the shell base.

Preferably, the length of the access portion is greater than the length of the support portion.

BRIEF DESCRIPTION OF THE DRAWINGS

Other features and advantages of the present disclosure will become apparent in the following detailed description of the embodiment with reference to the accompanying drawings, of which:

FIG. 11 is a fragmentary side view of the embodiment, showing the access portion at the closed position;

FIG. 12 is another fragmentary side view of the embodiment, showing the access portion while being moved away from the closed position;

DETAILED DESCRIPTION OF THE EMBODIMENT

Figure 1:
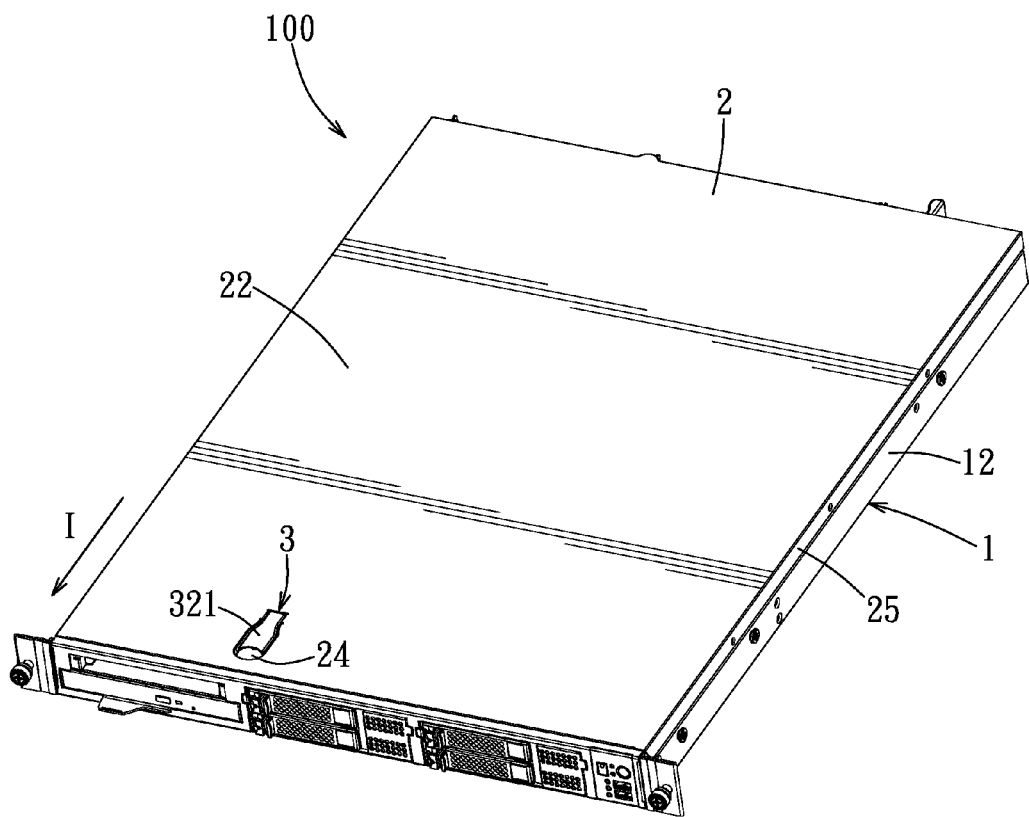
FIG. 1 is a perspective view of an embodiment of an electronic apparatus according to the present disclosure, showing an access portion of a latch mechanism at a closed position.
Figure 2:
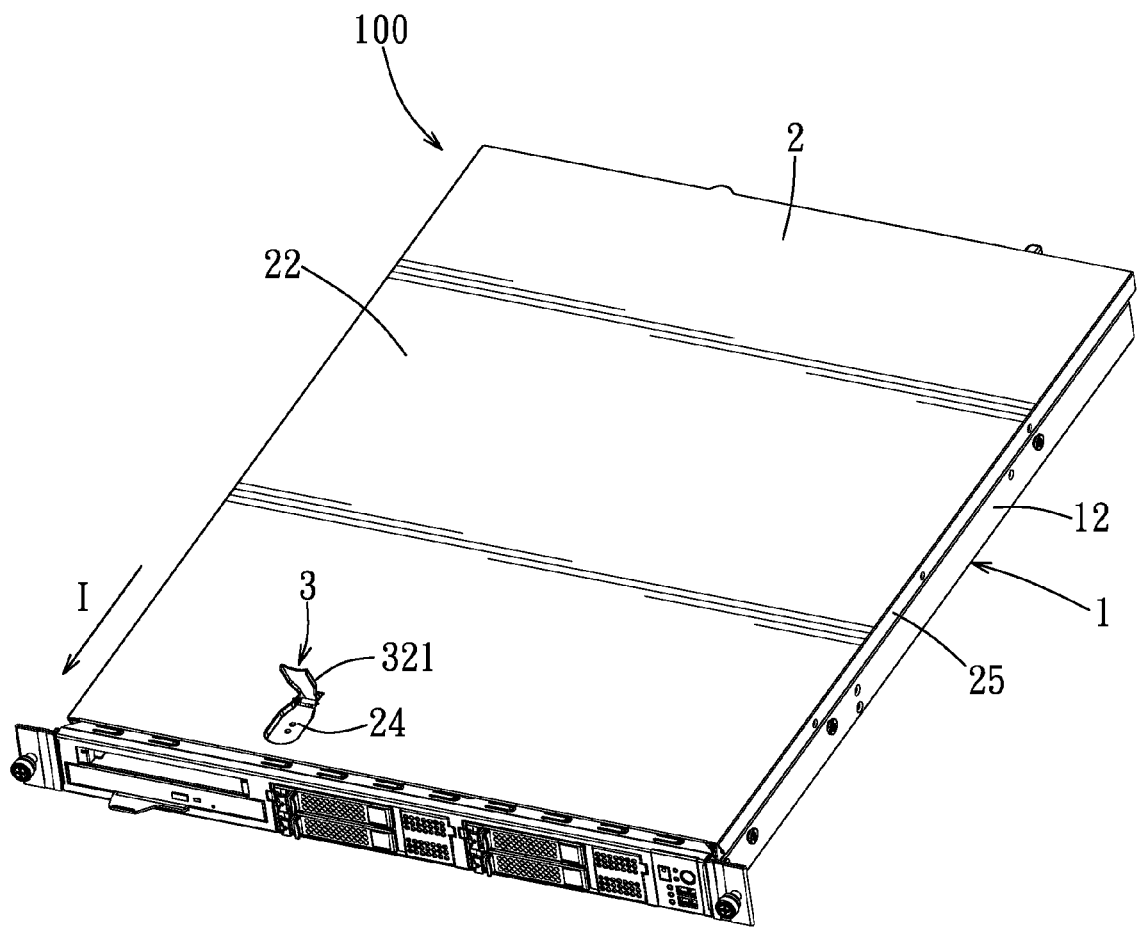
FIG. 2 is another perspective view of the embodiment, showing the access portion at an open position.

With reference to FIGS. 1 and 2, an embodiment of the electronic apparatus 100 of the present disclosure comprises a shell base 1, a shell cover 2, and a latch mechanism 3. The shell cover 2 is coupled detachably to the shell base 1 and is slidable relative to the shell base 1 along a slide direction (I). The electronic apparatus 100 in this embodiment is configured as a computer server comprising a casing that is a combination of the shell base 1 and the shell cover 2.

Figure 3:
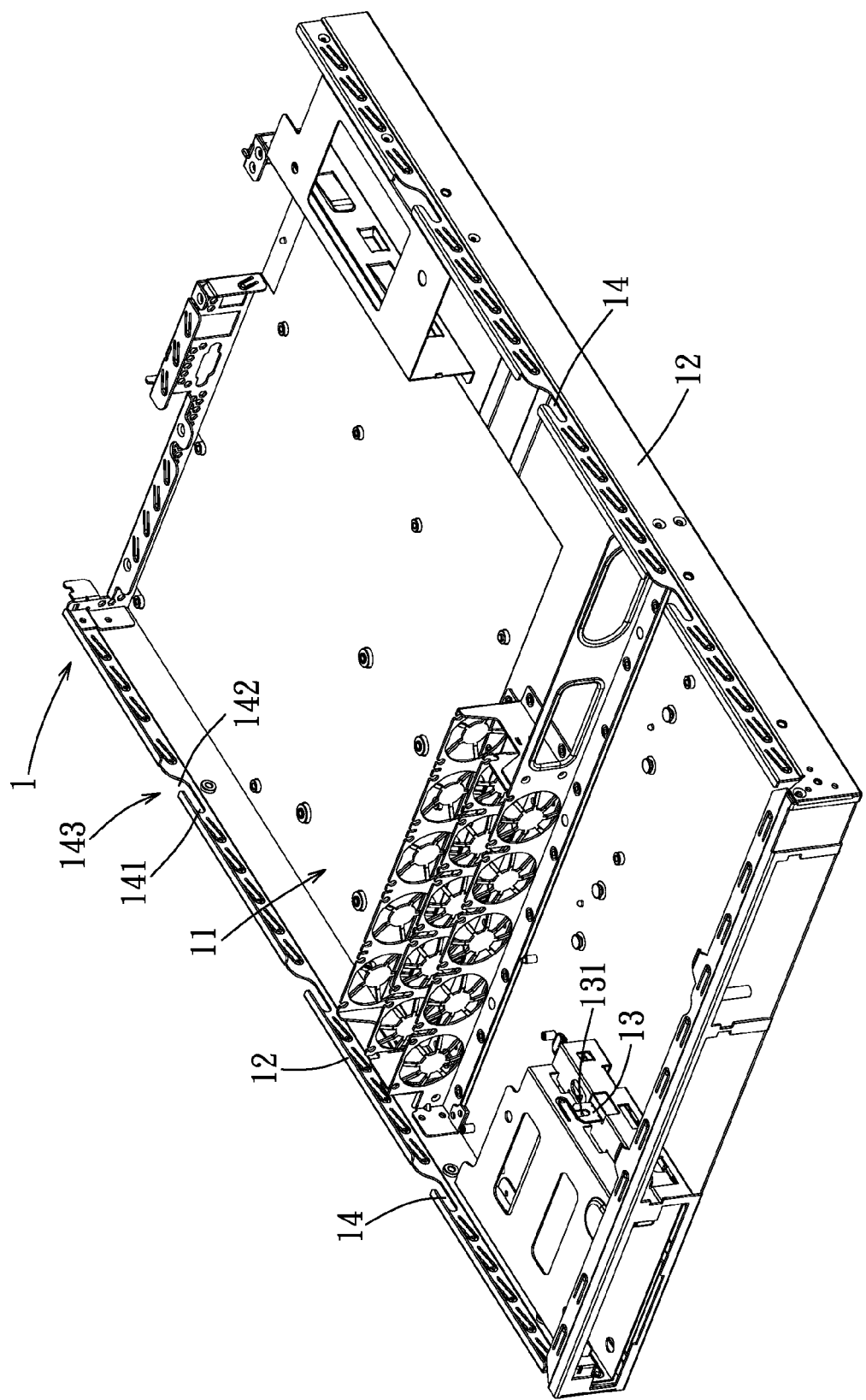
FIG. 3 is a perspective view of a shell base of the embodiment.
Figure 4:
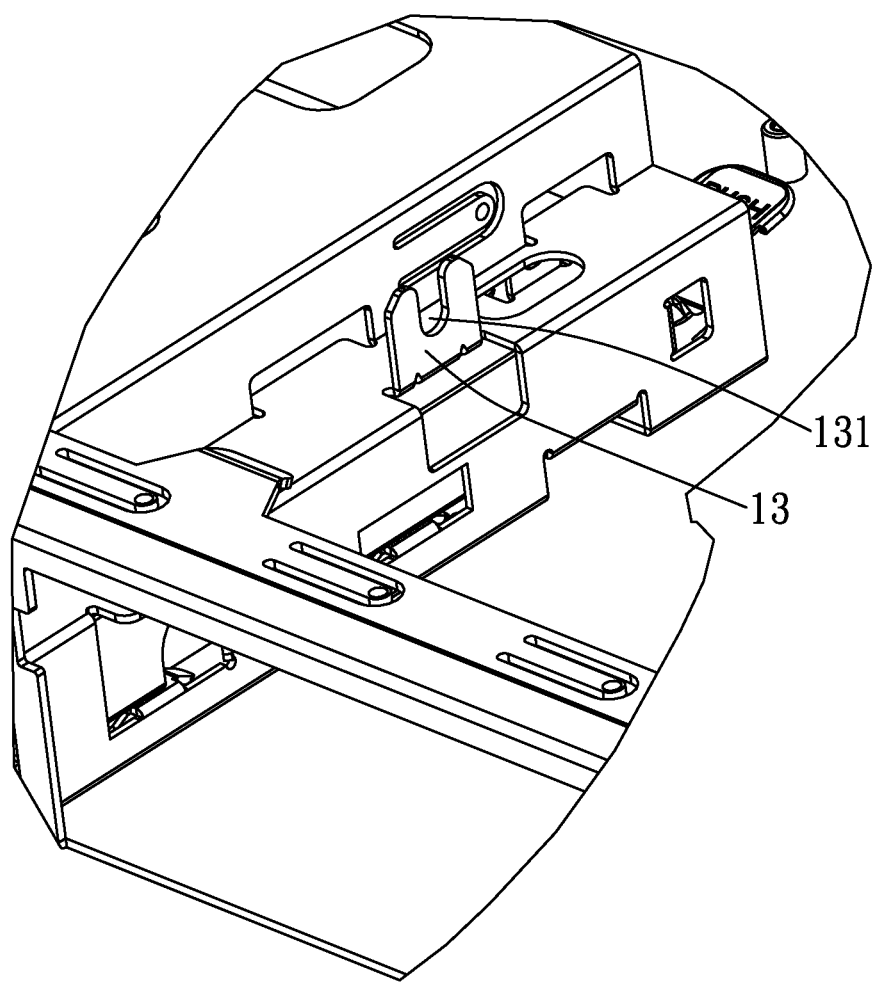
FIG. 4 is an enlarged perspective view of an abutment portion and a limit groove of the shell base.

As illustrated in FIGS. 3 and 4, the shell base 1 defines an internal space 11, and includes a pair of first lateral walls 12 that act as the sliding edges by which the shell cover 2 may slide on and off the shell base 1. Each of the first lateral walls 12 is formed with a plurality of slide grooves 14 that extend substantially in the slide direction (I). Each of the slide grooves 14 has a front groove end 141, a rear groove end 142, and an opening 143 that is adjacent to the rear groove end 142. Within the internal space 11, the shell base 1 further includes an abutment portion 13 that is configured as a U-shaped plate and that has a limit groove 131 that opens upwardly.

Figure 5:
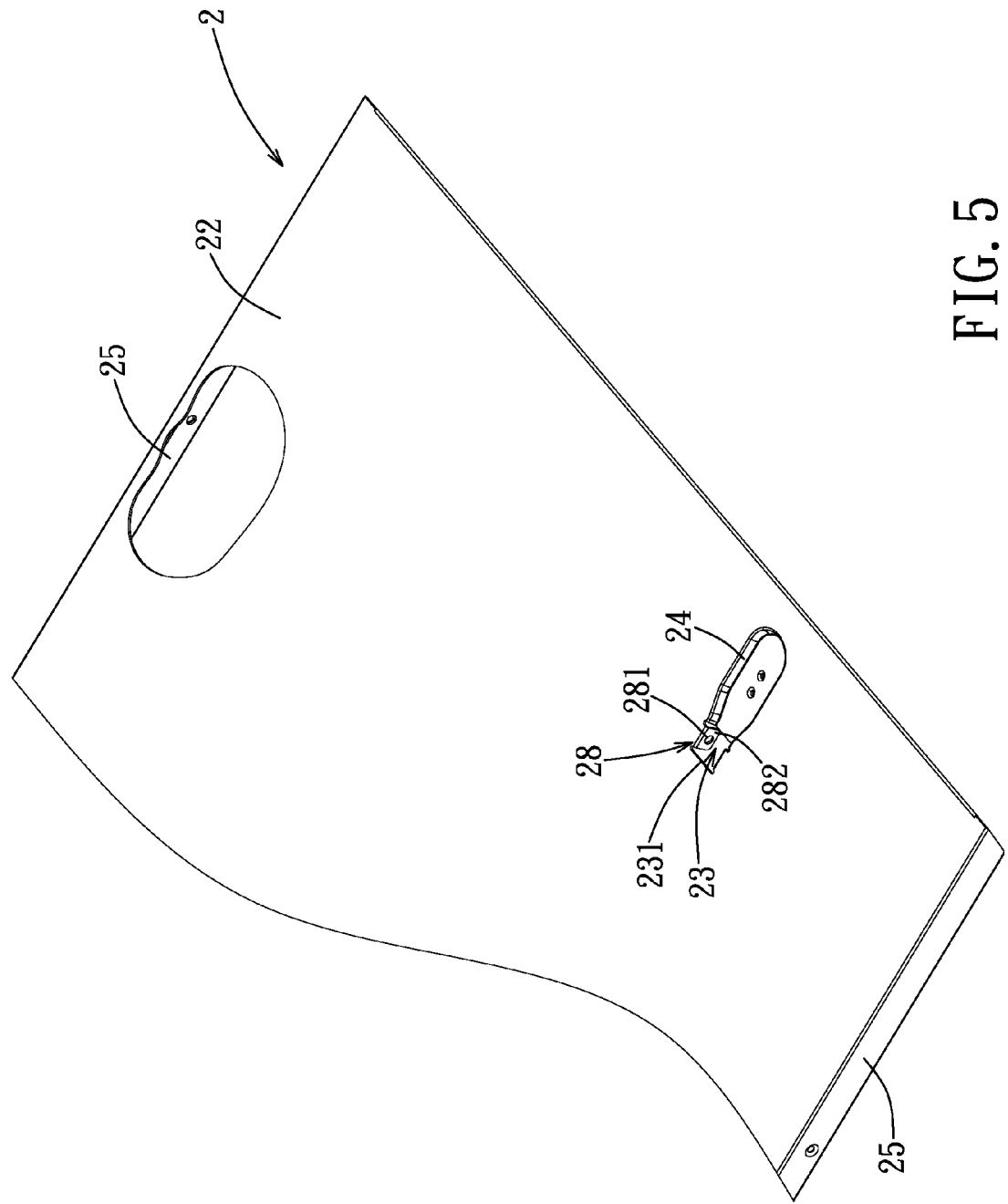
FIG. 5 is a fragmentary perspective view of the shell cover.
Figure 6:
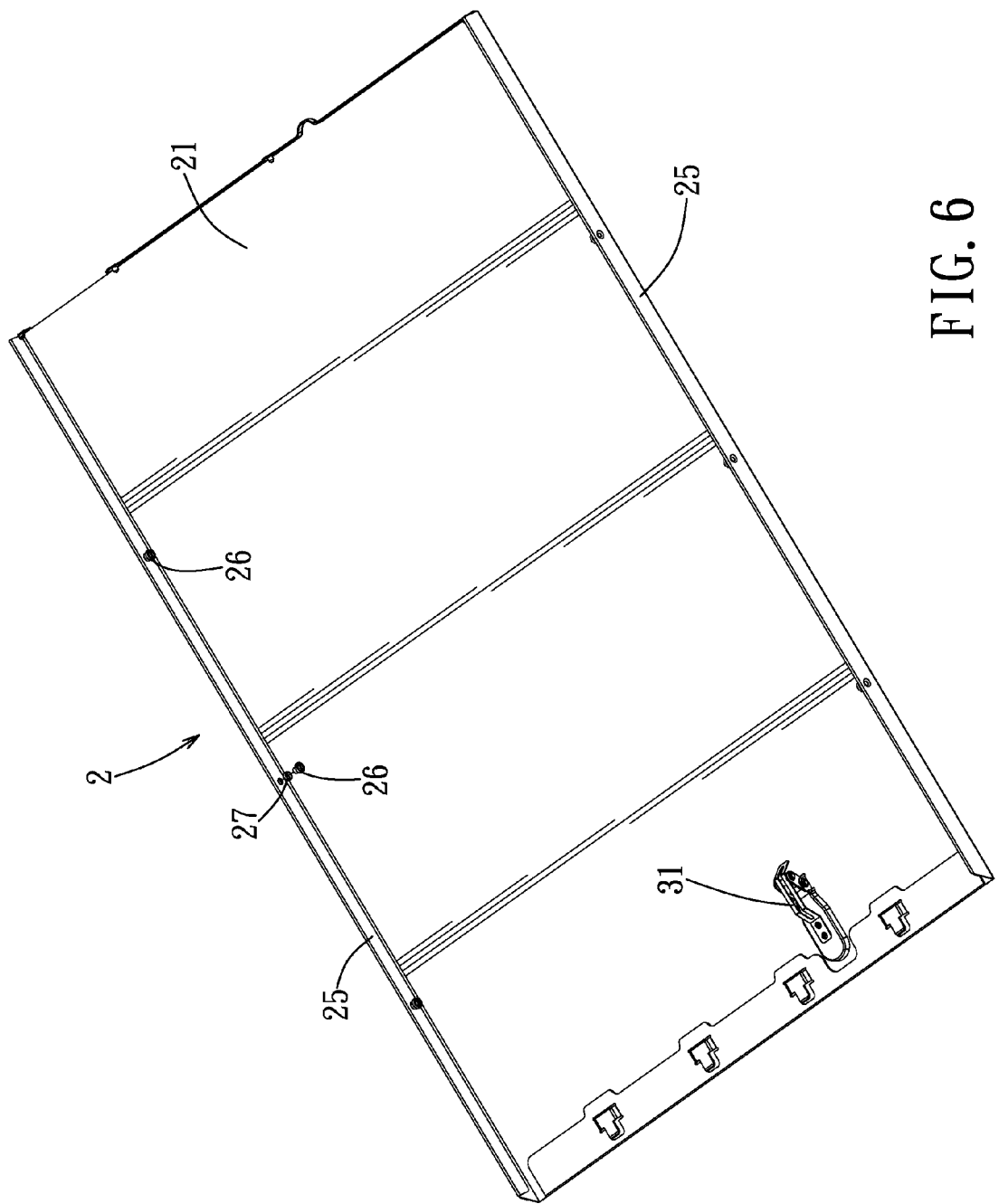
FIG. 6 is a perspective view of the shell cover and the latch mechanism.
Figure 7:
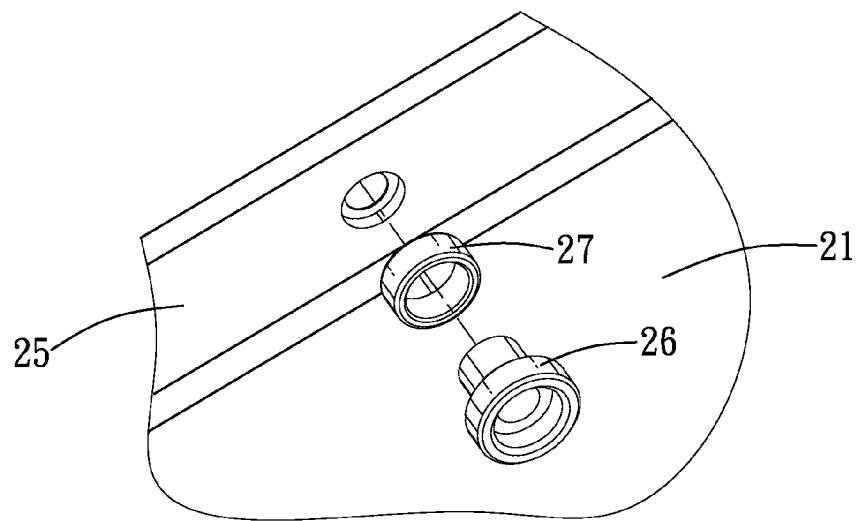
FIG. 7 is an enlarged fragmentary exploded perspective view of the shell cover, illustrating a positioning member and a ring member.

Referring to FIGS. 5 and 6, the shell cover 2 has an outer surface 22, an inner surface 21 opposite to the outer surface 22, a through hole 23 extending through the inner and outer surfaces 21, 22, and a receiving groove 24. Further referring back to FIGS. 1 and 3, the shell cover 2 covers the internal space 11, with the inner surface 21 facing the internal space 11. The through hole 23 and the limit groove 131 of the abutment portion 13 are aligned. The receiving groove 24 is formed in the outer surface 22 of the shell cover 2 and is in spatial communication with the through hole 23.

As depicted in FIGS. 1, 3, 6, and 7, the shell cover 2 further has a pair of second lateral walls 25 that are parallel to the first lateral walls 12 of the shell base 1 and that are disposed respectively at lateral outer sides of the first lateral walls 12, a plurality of positioning members 26 that are connected to the second lateral walls 24 and that correspond in position to the slide grooves 14, and ring members 27 that surround rotatably and respectively the positioning members 26. When the shell cover 2 and the shell base 1 are joined together, the positioning members 26 fit respectively into the slide grooves 14 through the openings 143 and can slide back and forth in the slide grooves 14. The ring members 27 are capable of reducing friction between the positioning members 26 and the second lateral walls 25 during the movement of the positioning members 26 in the slide grooves 14.

Figure 8:
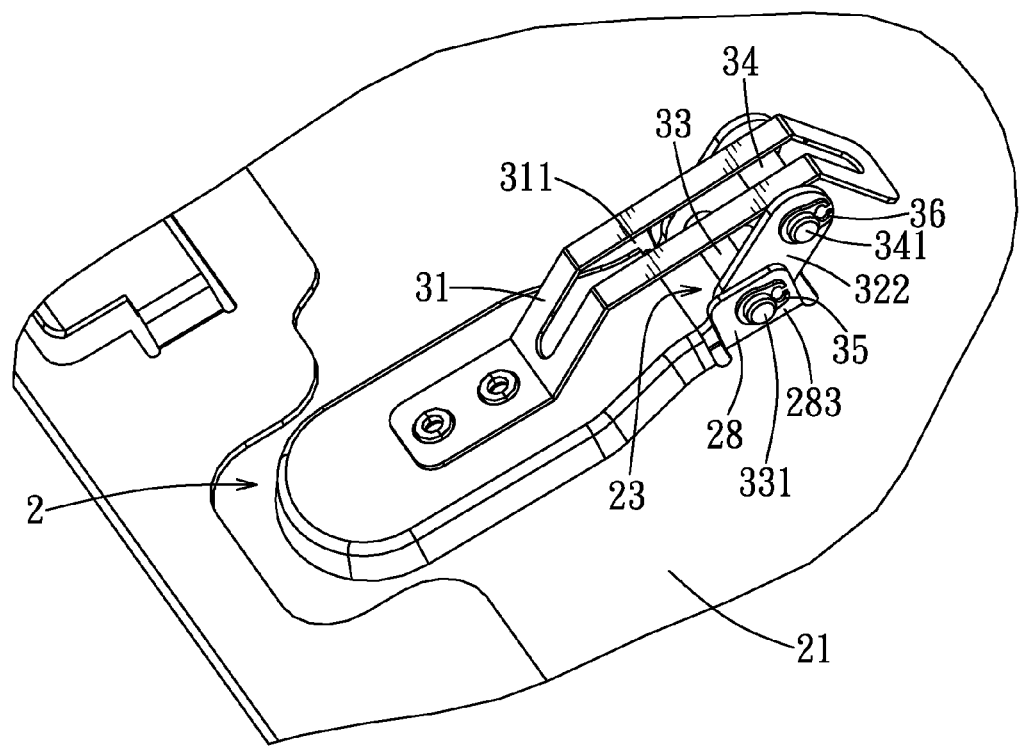
FIG. 8 is an enlarged fragmentary perspective view of the latch mechanism and the shell cover when the access portion is at the closed position.
Figure 9:
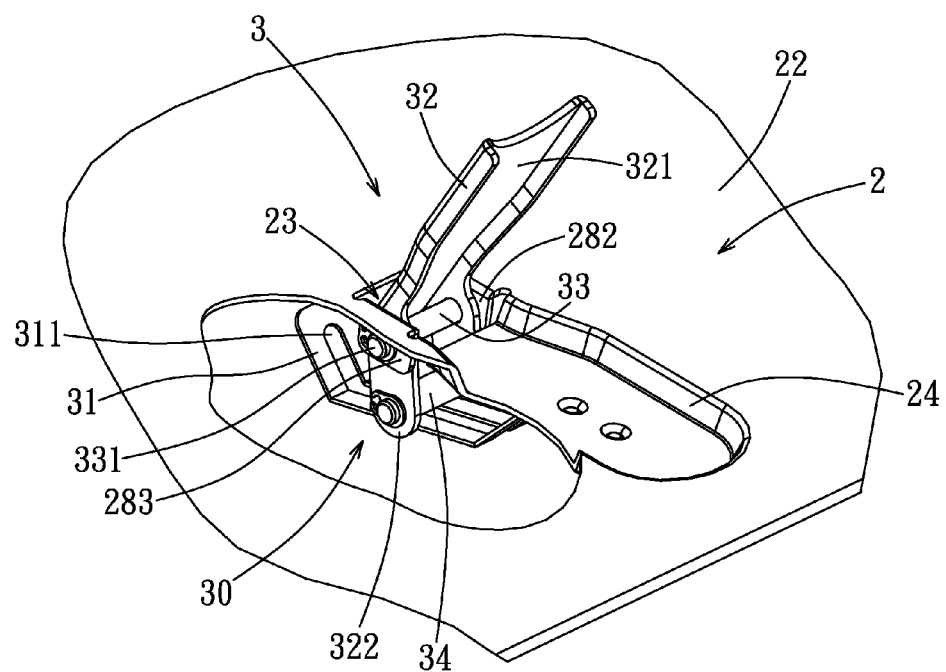
FIG. 9 is another enlarged fragmentary perspective view of the latch mechanism and the shell cover when the access portion is moved away from the closed position.
Figure 10:
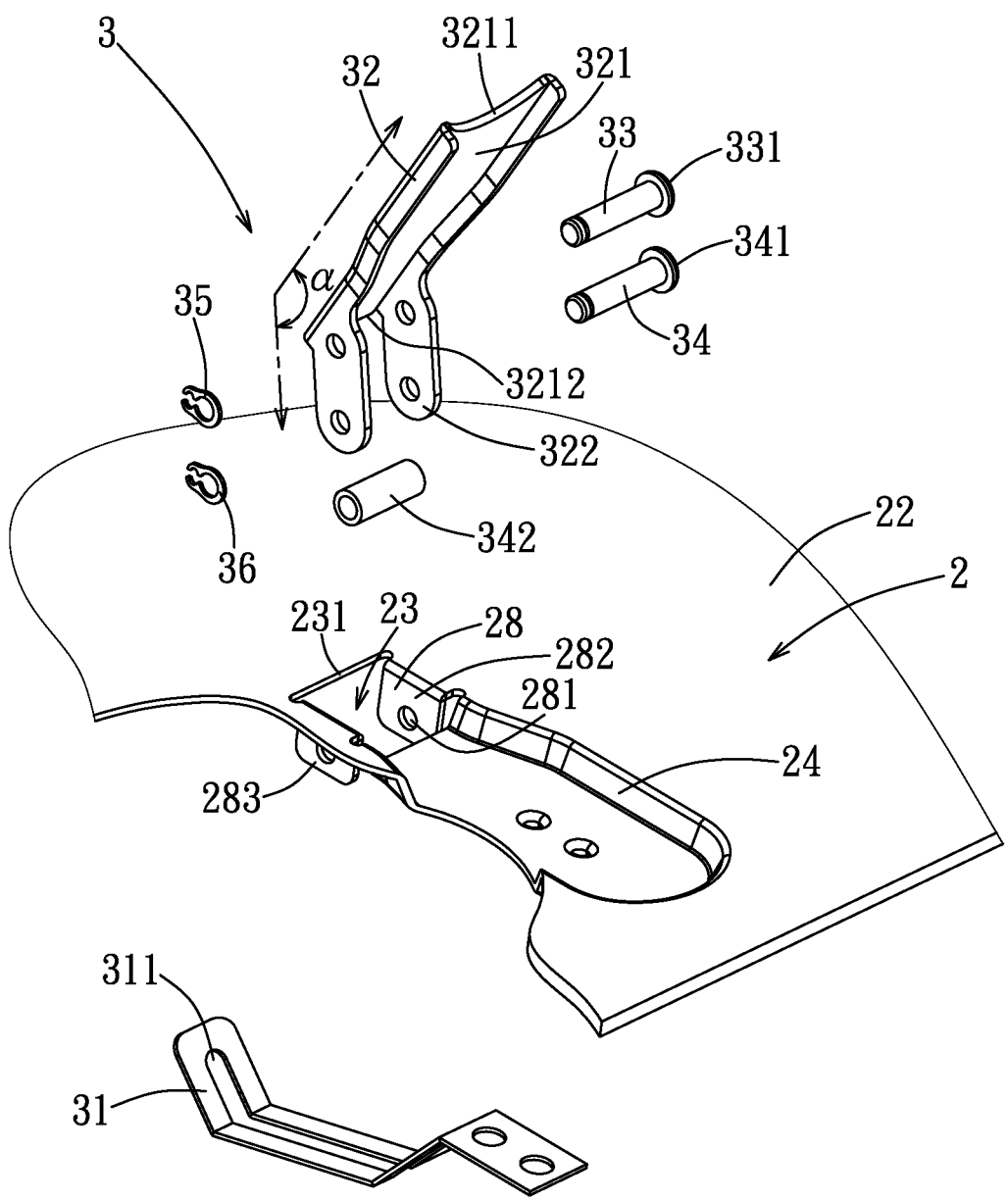
FIG. 10 is a fragmentary exploded perspective view of the latch mechanism and the shell cover.

The latch mechanism 3 depicted in FIGS. 8 to 10 includes a driving module 30 and a resilient member 31. The driving module 30 includes an operating component 32, a pivot axle 33, and a driving axle 34. The operating component 32 has an access portion 321 that is disposed outside the shell cover 2 and that corresponds in position to the receiving groove 24, and a pair of spaced-apart support portions 322 that extend from the access portion 321 into the internal space 11 through the through hole 23. The access portion 321 has a distal end 3211 and a connecting end 3212 opposite to the distal end 3211. The support portions 322 are parallel to each other and are connected respectively to lateral edges of the access portion 321 at positions adjacent to the connecting end 3212. The access portion 321 and the support portions 322 form an obtuse angle ($\alpha$) therebetween.

Also with reference to FIG. 5, the shell cover 2 further has two parallel engaging members 28 extending downwardly therefrom into the internal space 11 and disposed at opposite lateral sides of the through hole 23. Each engaging member 28 has an engaging hole 281, an inner side surface 282 facing the other engaging member 28, and an outer side surface 283 opposite to the inner side surface 282. The pivot axle 33 is adjacent to the through hole 23, extends through the support portions 322 of the operating member 32 and the corresponding engaging holes 281 of the engaging members 28, and has a pair of end parts 331 disposed respectively at opposite lateral sides of the engaging members 28. One of the end parts 331 is larger than the engaging holes 281 so as to abut against the outer side surface 283 of the corresponding engaging member 28, while the other one of the end parts 331 is engaged with a snap ring 35 so as to be positioned relative to the corresponding engaging member 28.

With reference to FIGS. 8 to 10, the driving axle 34 has an axle rod 341 and a sleeve member 342. The axle rod 341 extends through the support portions 322, and is locked into place using another snap ring 36. The sleeve member 342 is disposed between the support portions 322 and is sleeved rotatably on the axle rod 341. The pivot axle 33 and the driving axle 34 are spaced apart from each other and are respectively proximate to and distal from the connecting end 3212 of the access portion 321. With further reference to FIG. 11, the driving axle 34 is disposed in the internal space 11 and is received and vertically-movable in the limit groove 131 of the abutment portion 13 of the shell base 1. The resilient member 31 is fastened to the inner surface 21 of the shell cover 2 and presses against the driving axle 34. In this embodiment, the resilient member 31 is bent from a strip of sheet metal, is fastened to the inner surface 21 of the shell cover 2 using rivets and is under the receiving groove 24. The resilient member 31 has an extension groove 311. The abutment portion 13 extends through the extension groove 311 (see FIG. 11).

Figure 13:
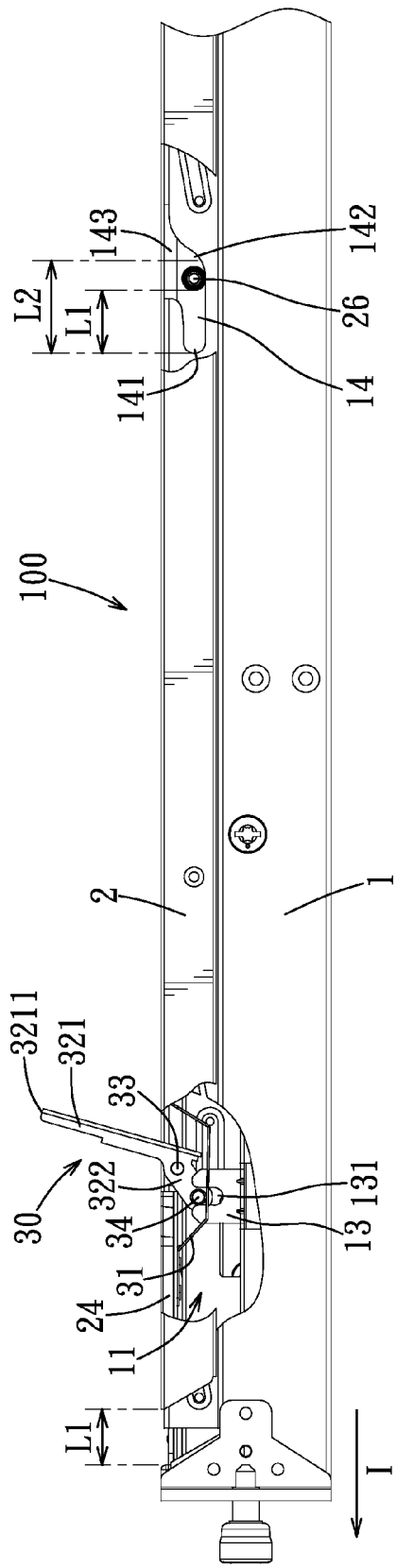
FIG. 13 is still another fragmentary side view of the embodiment, showing the access portion at the open position.

With reference to FIGS. 11 to 13, the access portion 321 is pivotable about the pivot axle 33 between a closed position (see FIG. 11) to be received in the receiving groove 24 and flush with the shell cover 2, and an open position (see FIG. 13), where the distal end 3211 is lifted away from the shell cover 2. In this embodiment, the driving module 30 is configured as a lever that uses the pivot axle 33 as the fulcrum, with a portion of the access portion 321 from the distal end 3211 to the pivot axle 33 being the lever arm and the support portions 322 being the resistance arm. The length of the lever arm is five times the length of the resistance arm. The length of the lever arm may be more than five times as long as the length of the resistance arm.

With reference to FIGS. 8 and 11, when the access portion 321 is at the closed position, the resilient member 31 presses against the driving axle 34. This prevents the latch from opening without outside forces acting upon the access portion 321. Because the access portion 321 is at the closed position, the shell cover 2 is prevented from shifting back and forth. At the closed position, the positioning members 26 are placed respectively within the front groove ends 141 of the slide grooves 14 and are thus prevented from shifting in the vertical direction.

With reference to FIGS. 9 and 12, as the access portion 321 is lifted away from the shell cover 2 towards the open position, the driving axle 34 is positioned in the slide direction (I) relative to the shell base 1 and is driven to move downwardly along the limit groove 131 while the pivot axle 33 is moved rearwardly in the slide direction (I). When the driving axle 34 reaches the bottom of the limit groove 131, the pivot axle 33 will be almost directly above the driving axle 34 and the resilient member 31 will be forced to bend downwards by the driving axle 34. When the driving axle 34 moves along the limit groove 131, it uses the sleeve member 342 (see FIG. 10) to roll against the abutment portion 13 and the resilient member 31, thus reducing friction between the moving parts.

Figure 14:
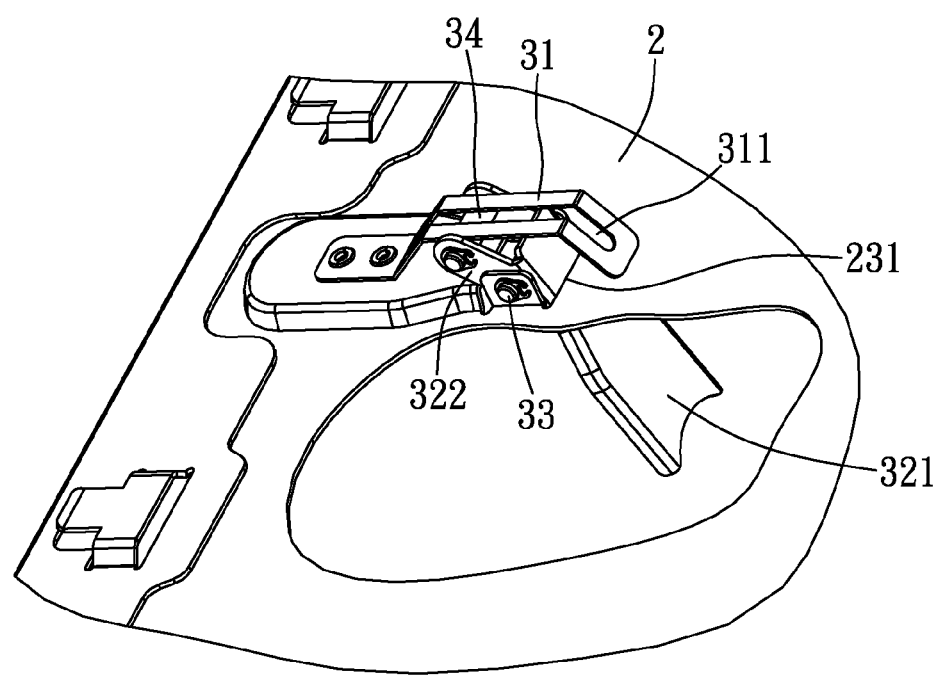
FIG. 14 is still another enlarged fragmentary perspective view of the latch mechanism and the shell cover when the access portion at the open position.

With reference to FIGS. 13 and 14, as the access portion 321 continues to move to the open position, the driving axle 34 will move upwards along the limit groove 131 and the pivot axle 33 will continue to slide backwards in the direction (I), also sliding the shell cover 2 in the same direction. At this point, the access portion 321 will make contact with the edge 231 of the through hole 23 (see FIG. 5), so the access portion 321 will not be able to flip completely over to make contact with the outer surface 22 of the shell cover 2, which prevents damage to the outer surface 22 of the shell cover 2. In addition, as the driving axle 34 rolls up in the limit groove 131, the resilient member 31 presses against the driving axle 34, thereby moving the driving axle 34 upwardly back to its resting position when the force exerted against the resilient member 31 is released. This allows the access portion 321 to be maintained at the open position without any external forces exerted upon it. Thus, when reattaching the shell cover 2 to the shell base 1, it is easy to ensure that the driving axle 34 and the limit groove 131 are properly aligned.

With reference to FIGS. 11 and 13, as the access portion 321 moves from the closed position to the open position, the shell cover 2 will also move relative to the shell base 1 by sliding for a distance (L1). Each of the slide grooves 14 has a length of (L2), which is slightly longer than the distance (L1). As the shell cover 2 slides backwards, each of the positioning members 26 will also slide backwards from the corresponding front groove end 141 to the corresponding rear groove end 142, thereby being permitted to leave the corresponding slide groove 14 through the corresponding opening 143. At this point, the shell cover 2 and the shell base 1 may be separated by lifting the shell cover 2 away from the shell base 1.

In order to replace the shell cover 2 onto the shell base 1, the shell cover 2 is first positioned onto the shell base 1 so that the positioning members 26 are aligned respectively with the openings 143 and can rest respectively in the rear groove ends 142 (see FIG. 13). Also, the abutment portion 13 extends through the extension groove 311 and the driving axle 34 is engaged with the limit groove 131. Then, the access portion 321 is lifted towards the closed position, which will push the driving axle 34 downwardly along the limit groove 131 against the resilient force of the resilient member 31 and move the pivot axle 33 forwardly in the direction (I). As the access portion 321 moves toward the closed position, the shell cover 2 will simultaneously move with the access portion 321. As in FIG. 12, when the access portion 321 moves towards the closed position, the resilient member 31 will bend away from the inner surface 21 of the shell cover 2 and when the driving axle 34 reaches the bottom of the limit groove 131, the resilient member 31 will spring back into its original shape to force the access portion 321 into the closed position without any additional effort from the user. This reduces the effort required to attach the shell cover 2 to the shell base 1.

To sum up, the driving module 30 of this embodiment uses the concept of levers to slide the shell cover 2. This not only reduces the physical strength required for removing and replacing the shell cover 2, but also increases efficiency by allowing the shell cover 2 to be removed with a single hand. Additionally, the driving axle 34 includes a sleeve member 342 that allows the driving axle 34 to roll instead of slide, and the positioning members 26 are surrounded by the ring members 27 that enable the shell cover 2 to roll instead of slide in the limit groove 131. This rolling capability reduces the friction between moving parts and allows the shell cover 2 to be removed with even less effort expended.

While the present disclosure has been described in connection with what is considered the most practical embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. An electronic apparatus comprising:
   a shell base defining an internal space and having an abutment portion that is disposed in said internal space and that is formed with a limit groove opening upwardly;
   a shell cover coupled detachably to said shell base, covering said internal space and slidable relative to said shell base along a slide direction, said shell cover having a through hole aligned with said limit groove of said abutment portion; and
   a latch mechanism including
      an operating component that has an access portion disposed outside said shell cover, and a pair of spaced-apart support portions extending from said access portion into said internal space through said through hole,
      a pivot axle that is adjacent to said through hole, that extends through said support portions of said operating component, and that has a pair of end parts disposed respectively at opposite lateral sides of said support portions, said end parts being coupled rotatably to said shell cover, and
      a driving axle that extends through said support portions of said operating component, that is spaced apart from said pivot axle, that is disposed in said internal space and that is received and vertically-movable in said limit groove of said abutment portion of said shell base, said access portion being pivotable about said pivot axle between a closed position to be flush with said shell cover, and an open position, wherein a distal end of said access portion is away from said shell cover,
   wherein, during movement of said access portion from the closed position to the open position, said driving axle is positioned in the slide direction relative to said shell base due to engagement between said driving axle and said abutment portion, thereby resulting in movement of said pivot axle and said shell cover in the slide direction relative to said shell base;
   wherein said shell cover further has an inner surface facing said internal space, said latch mechanism further including a resilient member that is fastened to said inner surface of said shell cover and that biases said driving axle upwardly for maintaining said access portion at the open and closed position; and wherein said resilient member is bent from a strip of sheet metal, and has an extension groove for extension of said abutment portion.

2. The electronic apparatus as claimed in claim 1, wherein said driving axle includes an axle rod affixed to said support portions of said operating component, and a sleeve member sleeved rotatably on said axle rod.

3. The electronic apparatus as claimed in claim 1, wherein said access portion has said distal end and a connecting end opposite to said distal end, said support portions being parallel to each other and connected respectively to lateral edges of said access portion at positions that are adjacent to said connecting end of said access portion, said pivot axle and said driving axle being respectively proximate to and distal from said connecting end of said access portion.

4. The electronic apparatus as claimed in claim 3, wherein said support portions and said access portion form an obtuse angle therebetween.

5. The electronic apparatus as claimed in claim 4, wherein the length from said distal end of said access portion to said pivot axle is at least five times the length from said driving axle to said pivot axle.

6. The electronic apparatus as claimed in claim 1, wherein said abutment portion is a U-shaped plate.

7. The electronic apparatus as claimed in claim 1, wherein said shell cover further has an outer surface opposite to said internal space and formed with a receiving groove that receives said access portion when said access portion is at the closed position, and that is in spatial communication with said through hole.

8. The electronic apparatus as claimed in claim 1, wherein:
said shell base further has a pair of first lateral walls, each of said first lateral walls being formed with a plurality of slide grooves that extend substantially in the slide direction, each of said slide grooves having a rear groove end, a front groove end and an opening that is adjacent to said rear groove end;
said shell cover further has a pair of second lateral walls parallel to and disposed respectively at lateral outer sides of said first lateral walls, and a plurality of positioning members connected to said second lateral walls and corresponding in position to said slide grooves; and
said positioning members are retained respectively in said front groove ends of said slide grooves when said access portion is at the closed position so that vertical movement of said shell cover relative to said shell seat is not permitted, said positioning members sliding respectively along said slide grooves from a corresponding front groove end to a corresponding rear groove end while said shell cover moves in the slide direction relative to said shell base during movement of said access portion from the closed position to the open position, thereby allowing said positioning members to slide out of said slide grooves and said shell cover to be detached from said shell base.

9. The electronic apparatus in claim 8, wherein said shell cover further has a plurality of ring members surrounding rotatably and respectively said positioning members.

10. A latch mechanism adapted for use in an electronic apparatus, the electronic apparatus including a shell base that has an abutment portion being a U-shaped plate and formed with a limit groove, and a shell cover that is coupled detachably to the shell base and that has a through hole and an inner surface facing the shell base, said latch mechanism comprising:

an operating component that has an access portion adapted to be disposed outside the shell cover, and a pair of spaced-apart support portions adapted to extend from said access portion through the through hole;

a pivot axle that is adapted to be adjacent to the through hole, that extends through said support portions of said operating component, and that has a pair of end parts disposed respectively at opposite lateral sides of said support portions and adapted to be coupled rotatably to the shell cover; and a driving axle that extends through said support portions of said operating component, that is spaced apart from said pivot axle and that is adapted to be received and vertically-movable in the limit groove of the abutment portion of the shell base, said access portion being pivotable about said pivot axle between a closed position, wherein said access portion is adapted to be flush with the shell cover, and an open position, wherein a distal end of said access portion is adapted to be away from the shell cover;

wherein, during movement of said access portion from the closed position to the open position, said driving axle is adapted to be positioned relative to the shell base due to engagement between said driving axle and the abutment portion, thereby resulting in movement of said pivot axle and the shell cover in the slide direction relative to the shell base;

wherein said latch mechanism further comprises a resilient member that is adapted to be fastened to the inner surface of the shell cover and that biases said driving axle upwardly for maintaining said access portion at the open or closed position; and wherein said resilient member is bent from a strip of sheet metal, and has an extension groove adapted for extension of the abutment portion.

11. The latch mechanism as claimed in claim 10, wherein said driving axle includes an axle rod affixed to said support portions of said operating component, and a sleeve member sleeved rotatably on said axle rod.

12. The latch mechanism as claimed in claim 10, wherein said access portion has said distal end and a connecting end opposite to said distal end, said support portions being parallel to each other and connected respectively to lateral edges of said access portion at positions that are adjacent to said connecting end of said access portion, said pivot axle and said driving axle being respectively proximate to and distal from said connecting end of said access portion.

13. The latch mechanism as claimed in claim 12, wherein said support portions and said access portion form an obtuse angle therebetween.

14. The latch mechanism as claimed in claim 13, wherein the length from said distal end of said access portion to said pivot axle is at least five times the length from said driving axle to said pivot axle.

15. A method for removing a shell cover from a shell base, the shell base having an abutment portion being a U-shaped plate that is formed with a limit groove, the shell cover having a through hole and an inner surface that faces the shell base, a latch mechanism being provided to include an operating component that has an access portion disposed outside the shell cover, and a pair of spaced-apart support portions extending from the access portion through the through hole, a pivot axle that is adjacent to the through hole, that extends through the support portions of the operating component, and that has a pair of end parts disposed respectively at opposite lateral sides of the support portions and coupled rotatably to the shell cover, a driving axle that extends through the support portions of the operating component, that is spaced apart from the pivot axle, that is received and vertically-movable in the limit groove of the abutment portion of the shell base, and a resilient member bent from a strip of sheet metal, having an extension groove adapted for extension of the abutment portion, fastened to the inner surface of the shell cover and biases the driving axle for maintaining position of the access portion, the method comprising the following steps:

(a) lifting the access portion of the operating component, causing the access portion to pivot about the pivot axle; and (b) further pivoting the access portion about the pivot axle such that the pivot axle moves from the front of the abutment portion to behind the abutment portion due to the pivot engagement between the support portion of the operating component and the abutment portion of the shell base, causing the shell cover to slide backward relative to the shell base, thereby allowing the shell cover to be separated from the shell base.

16. The method as claimed in claim 15, wherein the access portion and the support portion of the operating component form an obtuse angle therebetween.

17. The method as claimed in claim 15, wherein the length of the access portion is greater than the length of the support portion.

18. The method as claimed in claim 17, wherein the length of the access portion is at least five times as great as the length of the support portion.

* * * * *